United States Patent [19]

Agostinelli et al.

[11] Patent Number: 4,833,103

[45] Date of Patent: May 23, 1989

[54] PROCESS FOR DEPOSITING A III-V COMPOUND LAYER ON A SUBSTRATE

[75] Inventors: John A. Agostinelli; Henry J. Gysling, both of Rochester, N.Y.

[73] Assignee: Eastman Kodak Company, Rochester, N.Y.

[21] Appl. No.: 62,670

[22] Filed: Jun. 16, 1987

[51] Int. Cl.$^4$ ................................................ B05D 5/12
[52] U.S. Cl. .................................. 437/231; 427/108; 427/110; 427/123; 427/226; 427/229; 437/234; 437/245
[58] Field of Search ................... 427/87, 229, 226, 88, 427/108, 123, 110, 383.7, 383.5, 372.2; 437/104, 231, 82, 234, 245

[56] References Cited

U.S. PATENT DOCUMENTS

| | | | |
|---|---|---|---|
| 3,802,967 | 4/1974 | Ladany et al. | 148/171 |
| 3,877,982 | 4/1975 | Coldren | 437/234 |
| 4,250,205 | 2/1981 | Constant et al. | 427/87 |
| 4,427,714 | 1/1984 | Davey | 427/87 |
| 4,510,182 | 4/1985 | Cornils | 427/226 |
| 4,594,264 | 6/1986 | Jensen | 427/53.1 |

OTHER PUBLICATIONS

Zaouk et al., "Various Chemical Mechanisms for the Crystal Growth of III-V Semiconductors Using Coordination Compounds as Starting Material in the MOCVD Process", *Journal of Crystal Growth*, vol. 55, 1981, pp. 135–144.

Maury et al., "Raman Spectroscopy Characterization of Polycrystalline GaP Thin Films Grown by MO-CVD Process Using [Et$_2$Ga–PEt$_2$]$_3$ as Only Source", *Journal de Physique*, Colloque C1, Suppl. No. 10, vol. 43, Oct. 1982, pp. C1-347 to C1-252.

*Primary Examiner*—Janyce Bell
*Attorney, Agent, or Firm*—Carl O. Thomas

[57] ABSTRACT

A process comprising applying to a substrate a thin film comprised of a liquid carrier and a precursor selected from among compounds in which one or more pairs of group III and V elements are each joined by a thermally stable bond and the group III and V elements are each substituted with two thermally volatilizable ligands. The precursor is heated to a temperature in excess of 200° C. to remove its volatilizable ligands while leaving a ligand free III-V compound as a monophasic layer on the substrate.

10 Claims, No Drawings

PROCESS FOR DEPOSITING A III-V COMPOUND LAYER ON A SUBSTRATE

FIELD OF THE INVENTION

The present invention is directed to a processof producing a layer of a III-V compound.

BACKGROUND OF THE INVENTION

References to Group III, IV, and V elements follow art established designations of elements found in groups 13, 14, and 15, respectively, of the Periodic Table of elements as adopted by the American Chemical Society.

Following the discovery of the transistor, semiconductor application interest focused on group IV elements, first primarily on germanium and then on silicon. It was later recognized that useful and, for many applications, superior semiconductor properties are provided by III-V compounds—that is, compounds consisting of group III and group V elements. This has led to intensive investigations of processes for preparing layers of III-V compounds, particularly processes offering the stringent control of III-V compound layer stoichiometry, purity, uniformity, and thickness required for successful semiconductor applications.

The most commonly employed approach for preparing III-V compound layers is chemical vapor deposition (CVD), which includes both vapor phase epitaxy (VPE) and metalorganic chemical vapor deposition (MOCVD). A gaseous compound of a group III element and a gaseous compound of a group V element are introduced into a vacuum chamber and thermally decomposed in the presence of a substrate. Although extensively used, this process exhibits a number of disadvantages. First, there is the safety hazard of working with toxic gases. Second, each of the group III element and group V element compounds are pyrophoric, reacting spontaneously with oxygen. Third, with the group III and group V elements being introduced as separate gases, the potential for layers which are stoichiometrically unbalanced in either the concentration of the group III or group V element is always present, and precise gas metering is required for balanced stoichiometry. Fourth, working with high vacuum equipment is time consuming, cumbersome, and operationally limiting.

Constant et al U.S. Pat. No. 4,250,205 discloses a variation on the CVD process described above. Instead of employing a gaseous compound of a group III element and a gaseous compound of a group V element as separate precursors for III-V compound deposition, a single gaseous precursor is employed which is a coordinatin compound of one group III element substituted with three volatilizable ligands and one group V element substituted with three volatilizable ligands. Such coordination compounds are also referred to in the art as III-V donor acceptor complexes and as III-V Lewis acid and Lewis base adducts. Constant et al teaches avoiding ligand elimination leading to polymeric compounds. Although the coordination compound approach offers better replication of ratios of III and V elements and to some extent ameliorates problems of toxicity and oxygen sensitivity, the limitations of using high vacuum equipment for coating remain unabated.

Zaouk et al, "Various Chemical Mechanisms for the Crystal Growth of III-V Semiconductors Using Coordination Compounds as Starting Material in the MOCVD Process", *Journal of Crystal Growth*, Vol. 55, 1981, pp. 135–144 discloses a variation on the process of Constant et al wherein elimination of one ligand from each of the III and V elements of the precursor is recognized to occur during heating. Maury et al, "Raman Spectroscopy Characterization of Polycrystalline GaP Thin Films Grown by MO-CVD Process Using [Et$_2$-Ga-PEt$_2$]$_3$ As Only Source", *Journal de Physique*, Colloque C1, suppl. no. 10, vol. 43, Oct. 1982, pp. C1-347 to C1-252, is essentially cumulative with Constant et al and Zaouk et al, except for employing polymeric precursors as starting materials. Zaouk et al and Maury et al share the disadvantages of Constant et al.

Davey U.S. Pat. No. 4,427,714 describes forming III-V compound layers by spraying. For example, gallium arsenide layers are disclosed to be formed by processes including (1) spraying a solution of gallium arsenide or a precursor thereof with an inert gas propellant in a reducing gaseous atmosphere;

(2) spraying a solution of gallium/arsenic complex (each of the gallium and arsenic atoms having three substituent legands) with an inert gas propellant in an inert or reducing atmosphere;

(3) creating a stable aerosol of trimethyl gallium dispersed in arsine, which is sprayed on a hot substrate; and (4) spraying a polymeric complex formed between trimethyl gallium and methyl/phenyl arsine. All of the spraying processes are unattractive, since considerable unwanted deposition occurs on spray confining walls. Thus precursor waste and burdensome cleaning of equipment is encountered.

It has been recognized that III-V compound layers can be produced by supplying liquids to substrate surfaces. Ladany et al U.S. Pat. No. 3,802,967 discloses first forming a thin III-V compound layer by CVD techniques and then increasing the thickness of this layer by conventional liquid phase epitaxy. For instance, in Example 1 a liquid consisting of 97 percent gallium, 2.99 percent gallium arsenide, and 0.01 percent tellurium is flowed over a 10 micrometer CVD GaAs layer on a spinel substrate by tipping a graphite boat containing the liquid and substrate. The temperature of the liquid is maintained at 700° C. The Ladany et al process, since it begins with CVD, incurs all of the disadvantages of that process and in addition is unattractive in requiring very high temperatures for liquid phase epitaxy.

Jensen U.S. Pat. No. 4,594,264 discloses a process for preparing gallium arsenide layers on monocrystalline, gallium arsenide or silicon substrates. A gallium-arsenic complex is employed of the formula (I) 

where
X is chlorine, bromine, iodine, phenyl, benzyl, methyl, or trifluoromethyl, and
R is hydrogen, phenyl, benzyl, methyl, or trifluoromethyl.

The complex is dissolved in a hydrocarbon or chlorinated hydrocarbon solvent which is free of oxygen, sulfur, and nitrogen. The resulting solution is coated as a film on the substrate in an amount sufficient to form a gallium arsenide layer of from 1 to a few micrometers (μm) in thickness. The film is then heated to a temperature of less than 200° C. to volatilize the solvent while avoiding decomposition of the gallium-arsenic complex. The next step of the process is to convert the complex coating remaining to gallium arsenide by exposing the coating to ultraviolet (UV) radiation, such as the UV radiation from a laser. The presence of moisture and oxygen is avoided. All reactions were carried out under an inert, dry atmosphere (typically less than 1 ppm oxygen content) using purified, dry, oxygen-free solvents. Analysis of a layer produced from a complex of $Cl_3GaAs(C_6H_5)_3$ revealed that it had lost only 70 percent of the carbon and 54 percent of the chlorine of its parent coating as measured prior to UV exposure. These residual carbon and chlorine levels are, of course, unacceptably high for the majority of semiconductor uses.

SUMMARY OF THE INVENTION

In one aspect, this invention is directed to a process comprising applying to a substrate a precursor of a III–V compound, the precursor consisting of one or more pairs of ligand substituted group III and group V elements and thermally decomposing the precursor. The process is characterized in that (i) the precursor is selected from among compounds in which the group III and V elements of each pair are joined by a thermally stable bond and the group III and V elements are each substituted with two thermally volatilizable ligands, (ii) a thin film comprised of a liquid carrier and the precursor is applied to the substrate, and (iii) the liquid carrier and ligands are removed from the film, this step including heating the film to a temperature in excess of 200° C. to remove the volatilizable ligands while leaving a ligand free III–V compound as a monophasic layer on the substrate.

The process of the present invention offers significant advantages over prior art approaches to forming monophasic layers of III–V compounds. The process of the present invention in employing precursors containing pairs of III and V elements is inherently biased toward the desired stoichiometric balance of these elements. The process requires no particular control of ambient pressure during any step. Thus, the high vacuum equipment required by CVD can be entirely eliminated. At the same time, since spraying is not required to bring the precursor into contact with the substrate to be coated, indiscriminate loss of the precursor and fouling of equipment is avoided. No spray confining walls are required, and equipment is readily maintained free of unwanted depositions. The process of this invention allows thin, uniform layers of ligand free III–V compounds to be formed on a variety of substrates. Precise control of III–V compound layer thickness is readily achieved with the process of this invention. The process of this invention allows removal of precursor ligands (including all of their constituent elements) to leave III–V compound layers of purity levels satisfactory for semiconductor applications, including those requiring coatings of highly controlled purity levels. However, the process of the present invention does not require exceptionally high temperatures—i.e., temperatures in excess of about 650° C.

DESCRIPTION OF PREFERRED EMBODIMENTS

The present invention is directed to processes of forming layers of ligand-free III–V compounds, hereinafter, in accordance with art established usage, also referred to simply as III–V compounds. These compounds are formed of group III (boron, aluminum, gallium, and indium) and group V (nitrogen, phosphorus, arsenic, antimony, and bismuth) elements. The III–V compound layer can contain one or a combination of III–V compounds. For example, layers of binary III–V compounds, such as aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, boron nitride, boron phosphide, boron arsenide, and boron antimonide, are specifically contemplated.

It is also contemplated that the III–V compound layer can be formed with a mixture of III–V compounds, if desired. For example, in light guides and lasers it is conventional practice to employ ternary III–V compounds, such as gallium aluminum arsenide, with the proportion of aluminum being varied as needed to modify the layer for its intended light guiding function. Other combinations of ternary III–V compounds specifically recognized to be useful are gallium arsenide phosphide, indium gallium arsenide, indium gallium phosphide, indium arsenide phosphide, aluminum gallium phosphide, and aluminum gallium antimonide, as well as quaternary compounds, such as indium gallium arsenide phosphide.

For semiconductor applications the monophasic layer usually contains minor amounts of one or more dopants intended to impart N or P type conductivity. N type conductivity can be achieved by substituting for some of the group III elements in the III–V compound an element such as silicon or tin, or by by substituting from some of the group V elements sulfur, selenium, or tellurium. P type conductivity is achieved by substituting for some of the group III elements in the III–V compound an element such as zinc, cadmium, beryllium, or magnesium, or by substituting for some of the group V elements germanium. Dopant levels are generally limited to amounts sufficient to impart semiconductive properties. The exact proportions of dopant will vary with the application intended, with semiconductor dopant levels of from $10^{15}$ to $10^{18}$ ions per cc being common. For some applications, such as those in which higher than semiconductive levels of conductivity are required, higher, degenerate dopant levels can be in evidence. It is a distinct advantage of the process of this invention that all dopant concentration levels conventionally found in III–V compound layers, particularly those employed in the fabrication of solid state—e.g., semiconductor—elements, can be reproducibly achieved.

III–V compound layers of from about 20 to 2000 Angstroms in thickness can be deposited in a single iteration of the process of the present invention, with single iteration layer thicknesses preferably being in the range of from about 100 to 1000 Angstroms. Reiteration of the process can be undertaken to build up still thicker layers, if desired. Additionally, where the composition of the III–V compound layer deposited according to this process matches that of the substrate on which it is deposited, the III–V compound layer can form an epitaxial extension of the initially present substrate. Thus, depending upon the substrate chosen, a single iteration of the process of the present invention can result in a III–V compound layer of any desired thickness.

The III–V compound layer is monophasic, meaning that the layer consists of a single phase of material. The layer can be monocrystalline, polycrystalline, or amorphous, depending upon the manner of its formation and, particularly, the substrate on which it is formed.

The coating process of the present invention begins with the selection of a substrate for coating. Any conventional substrate for a III-V compound layer can be selected. While the III-V compound layer can be formed on any refractory—e.g., tungsten, silicon carbide, or the like, it is preferred for semiconductor applications that the III-V compound layer be formed on an insulative or, particularly, a semiconductive substrate. Exemplary of useful insulative substrates are silicon nitride, aluminum oxide (particularly monocrystalline aluminum oxide—i.e., sapphire), and silicon dioxide (including amorphous, monocrystalline, and glass forms). Glasses containing elements in addition to silicon and oxygen are contemplated, particularly glasses having a thermal coefficient of expansion which approximates that of the III-V compound layer to be formed—e.g., borosilicate glass and borophosphosilicate glass.

Semiconductive elements, particularly monocrystalline semiconductive wafers, are highly useful substrates for the practice of the invention. For example, any of the monocrystalline group IV or III-V compound wafers conventionally employed in the manufacture of semiconductor elements can be employed as substrates for the deposition of a III-V compound layer according to the present invention. For example, a major face lying in a {111}, {110}, or {100} crystal plane of a silicon or III-V compound (e.g., gallium arsenide, gallium phosphide, or indium phosphide) wafer can serve as an ideal substrate for a III-V compound layer. Substrate surfaces which match or at least approximate the crystal habit of the III-V compound forming the layer to be deposited are particularly advantageous in allowing III-V compound layers to be deposited which are monocrystalline and form an epitaxial extension of the original substrate.

An important aspect of the process of the present invention lies in the selection, from among known compounds, of the precursor of the III-V compound. For the practice of the present invention a precursor is chosen consisting of at least one pair of ligand substituted group III and group V elements. The group III and V elements of each pair are joined by a thermally stable bond, and the group III and V elements are each substituted with two thermally volatilizable ligands. These precursors differ markedly in their properties from the III-V coordination compounds (III-V donor acceptor complexes and III-V Lewis acid and Lewis base adducts) of the prior art in which each group III and group V element is substituted with three volatilizable ligands so that only a weak coordination bond exists between the group III and group V atoms.

In one aspect III-V compound precursors herein employed are those represented by formula II:

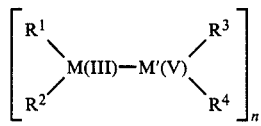
(II)

where
M(III) is a group III element;
M'(V) is a group V element;

$R^1$, $R^2$, $R^3$, and $R^4$ are independently chosen volatilizable ligands; and n is an integer of from 1 to 5.

Preferred group III elements are boron, aluminum, gallium, and indium. Preferred group V elements are nitrogen, phosphorus, arsenic, and antimony. Specifically preferred group III and V element combinations are gallium and arsenic, aluminum and arsenic, gallium and phosphorus, indium and phosphorus, boron and nitrogen, and aluminum and nitrogen.

Preferred volatilizable ligands are hydrogen, halogen (e.g., fluoride, chloride, bromide, and iodide), and hydrocarbon and substituted hydrocarbon ligands. The hydrocarbon ligands can be chosen from among aliphatic and aromatic hydrocarbons generally. Among useful hydrocarbon ligands are those consisting of simple hydrocarbon moieties, such as alkyl, alkenyl, alkynyl, and aryl groups, as well as hydrocarbon ligands which are composites of simple hydrocarbon moieties, such as alkaryl, aralkyl, aralkaryl, and alkaralkyl groups. Hydrocarbon ligand substituents can be selected from among a wide variety of known organic substituents and functional groups, including, but not limited to, halogen, hydroxy, mercapto, ether, thioether, alkanoyl, ester, thioester, dithioester, amino, amido, carbamoyl, sulfonamido, sulfamoyl, ureido, thioureido, carboxy, sulfonyl, sulfato, silyl, and similar groups. It is specifically contemplated that one or more heteroatoms, such as oxygen, sulfur, selenium, tellurium, or nitrogen atoms can with the hydrocarbon substituent form a heterocyclic ring.

Where it is desired that the ligand be entirely volatilized and none of its constituent elements employed to modify the III-V compound layer resulting, it is preferred to limit the ligands to those containing only one or more of hydrogen, halogen, carbon, and oxygen. Because of the recognized response of semiconductive layers to trace impurity concentrations, ligands containing elements which are themselves group III or V elements or which are known to be useful N or P conductivity type impurity dopants of III-V compounds are generally avoided, except where the ligands are intentionally chosen to modify the properties of the III-V compound layer to be formed.

The primary function of the ligands is to satisfy the two valence bonding positions of each group III and V element not satisfied by the thermally stable bond between pairs of group III and V elements. In addition the ligands are preferably chosen to facilitate coating the III-V compound precursor in a liquid carrier on the substrate. By choosing one or more of the ligands to be a hydrocarbon or a substituted hydrocarbon the vapor pressure of the III-V compound precursor can be reduced, thereby avoiding loss of III-V compound precursor molecules from the coating by evaporation. In addition, the increased bulk provided to the III-V compound precursor by hydrocarbon ligand inclusion can be usefully employed to raise the viscosity of the coating composition to optimum levels. On the other hand, if hydrocarbon ligands of excessive bulk are employed, the choice of liquid carriers capable of acting as solvents can be reduced, and coating composition viscosities can be raised beyond optimum levels.

Substituents of the hydrocarbon ligands can be chosen to facilitate dispersion of the III-V compound precursor in the carrier liquid and to modify the viscosity of the coating composition. For example, polar substituents of the hydrocarbon ligands can facilitate dissolving the III-V compound precursor in polar solvents. In many instances the inclusion of substituents permit inclusion of higher numbers of carbon atoms in the hydrocarbon ligands than would otherwise be attractive.

While individual hydrocarbon and substituted hydrocarbon ligands can have up to 20 or more carbon atoms, it is generally preferred to employ hydrocarbon and substituted hydrocarbon ligands containing from 1 to 10 carbon atoms. Specifically preferred hydrocarbon ligands are those in which aliphatic moieties consist of from 1 to 6 carbon atoms and aromatic moieties consist of from 6 to 10 carbon atoms.

In their simplest from the III-V compound precursors of this invention contain a single pair of group III and group V elements. For example, in formula II, n is 1. In this instance it can be seen that each group III and group V element exhibits only three bonding sites, and there is no weak fourth coordination bond, such as is in evidence in III-V coordination compounds. More particularly, the bond between the group III and group V elements is highly thermally stable. The group III and group V bond is, in fact, significantly more thermally stable than that linking the group III and group V elements with their ligands.

When the III-V compound precursor contains more than one pair of group III and group V elements—e.g., when n in formula II is greater than 1, it is generally accepted that the group III and group V elements are conjugated in a cyclic chain or ring. That is, each group III element is bonded to two ligands and to two adjacent group V elements, and each group V element is similarly bonded to two ligands and two adjacent group III elements. On heating these polymeric III-V compound precursors are believed to revert to corresponding monomer (e.g., n=1 in formula II).

In one specifically preferred form III-V compound precursors contemplated for use in the practice of the invention are those satisfying formula III:

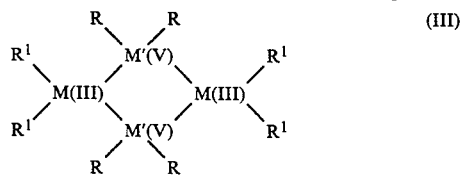

where

M(III) is a group III element, most preferably gallium, aluminu, or indium;

M'(V) is a group V element, most preferably nitrogen, phosphorus, or arsenic; and R and R' are independently hydrogen, halogen, or a hydrocarbon of from 1 to 10 carbon atoms, most preferably a hydrocarbon of from 1 to 6 carbon atoms.

Specific illustrations of III-V compound precursors contemplated for use in the practice of this invention are the following:

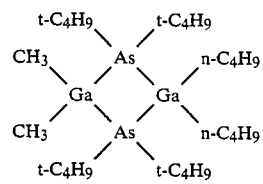 PC-1

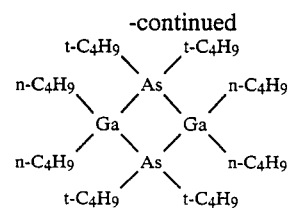 PC-2

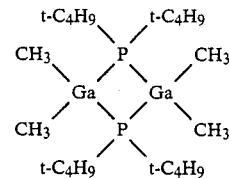 PC-3

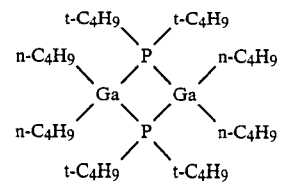 PC-4

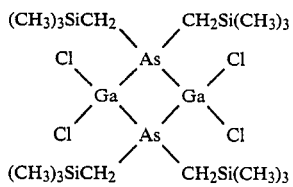 PC-5

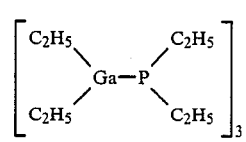 PC-6

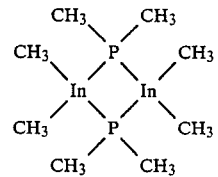 PC-7

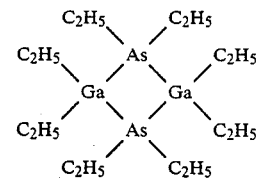 PC-8

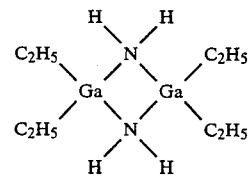 PC-9

Techniques for preparing III-V compound precursors for use in the practice of the present invention will be readily apparent from the teachings of A.M. Arif, B.L. Benac, A.H. Cowley, R. Geerts, R.A. Jones, K.B. Kidd, J.M. Power, and S.T. Schwab, "Mono- and Dinuclear Phosphido and Arsenido Complexes of Gallium; Ga(EBut$^t_2$)$_3$, Ga[PH(2,4,6-Bu$^t_3$C$_6$H$_2$)]$_3$ and Ga($\mu$-EBU$^t_2$)R$_2$]$_2$, E=P, As; R=Me,Bu$^{n}$", J. Chem. Soc., Chem. Commun., 1986, pp. 1543-1545; A. Zaouk, E. Salvetat, J. Sakaya, F. Maury, and G. Constant, "Various Chemical Mechanisms for the Crystal Growth of III-V Semiconductors Using Coordination Compounds as Starting Material in the MOCVD Process", *Journal of Crystal Growth,* Vol. 55, 1981, pp. 135-144; F. Maury, H. Combes, R. Caries, and J. B. Renucci, "Raman Spectroscopy Characterization of Polycrystalline GaP Thin Films Grown by MO-CVD Process Using [$Et_2Ga$-$PEt_2$]$_3$ As Only Source", *Journal de Physique,* Colloque C1, suppl. No. 10, vol. 43, Oct. 1982, pp. C1-347 to C1-252; and C. G. Pitt, A. P. Purdy, K. T. Higa, and R. L. Wells, "Synthesis of Some Arsinogallanes and the Novel Rearrangement of a Dimeric Bis(arsino)gallane, Bis{bis(bis[(tri-methylsilyl)methyl]arsino]arsino)-chlorogallane}", *Organometallics,* 1986, Vol. 5, p. 1266.

To apply the III-V compound precursor to the substrate a liquid coating composition is formed. The coating composition can be formed merely dissolving the precursor into a carrier liquid. To achieve the highest possible level of dispersion of the precursor in the carrier liquid, it is preferred to employ carrier liquids which are solvents for the precursor. Generally useful coating compositions can be formed when the precursor forms greater than 1 percent by weight of the coating composition, preferably at least about 5 percent by weight of the coating composition, based on total weight. The precursor can be introduced into the carrier liquid up to its solubility limit, if desired. A generally optimal precursor concentration range in the liquid carrier is from about 10 to 15 percent, based on total weight.

The next step is to apply the coating composition uniformly to the substrate. Any one of a variety of conventional coating techniques known to be capable of laying down thin, uniform coatings can be chosen for this purpose. For example, immersion or dip coating can be employed. A preferred technique for forming a thin, uniform coating on the substrate is by spin coating. This technique, which is widely used in forming thin, uniform photoresist composition coatings on semiconductors, involves applying a small amount of the coating composition to the substrate and then rotating the substrate. The centrifugal forces exerted by the spinning motion distribute coating composition uniformly on the substrate and result in excess coating material being expelled from the substrate surface along its edges. By controlling the rate of spinning and the viscosity of the coating composition, the thickness of the stable coating remaining of the substrate can be controlled. When the concentration of the III-V compound precursor in the coating composition is further taken into account, the coating required to produce a III-V compound layer of a desired thickness can be routinely ascertained.

Preferred carrier liquids are those which are solvents for the III-V compound precursor. In addition, the carrier liquid is preferably chosen to avoid reaction with the precursor. That is, a relatively nonreactive or inert carrier liquid is preferably chosen. It is also advantageous to choose a carrier liquid that is readily volatilized after coating. For example, carrier liquids which evaporate on standing under ambient conditions are advantageous, although carrier liquids that exhibit significant evaporative loss prior to coating are generally avoided. An alternative is to choose carrier liquids which are volatilized on heating prior to or along with the ligands in the course of converting the precursor into the desired III-V compound layer. Illustrations of specific carrier liquids are hydrocarbons, including substituted hydrocarbons, such as halogenated hydrocarbons, which are liquid under ambient conditions—e.g., benzene, toluene, octane, decane, terpenes, and similar hydrocarbons. Other liquid organic solvents are contemplated, particularly those that contain only carbon, hydrogen, halogen, or oxygen atoms. Alcohols, such as methanol, ethanol, isopropyl alcohol, and the like are contemplated liquid carriers. Ethers, such as dimethyl ether and diethyl ether, constitute another advantageous class of liquid carriers. Polar solvents, such a formamides (e.g., dimethylformamide), tetrahydrofuran, and water, can be used with precursors polar or polar substituent containing ligands (e.g., polar moiety substituted hydrocarbons).

The primary function of the carrier liquid is to provide a liquid phase for dispersing the III-V compound precursor. The carrier liquid is also chosen for its ability to cover the substrate uniformly. Thus, an optimum liquid carrier selection is in part determined by the substrate chosen. Generally more desirable film forming properties are observed with more viscous carrier liquids and those which more readily wet the substrate alone, or with an incorporated volatilizable film forming agent. In one form the film forming agent can take the form of a wetting agent, such as a volatilizable surfactant. Depending upon the composition of the atmosphere chosen for carrier liquid volatilization, other film forming agents can be employed. For example, organic compounds capable of being volatilized in a reducing (e.g., hydrogen) atmosphere can be employed.

After the III-V compound precursor coating has been formed on the substrate and preferably after the liquid carrier has spontaneously evaporated or been removed by mild heating, the coating is heated to volatilize the ligands. Although precursor decomposition can actually begin at ambient temperatures or temperatures only slightly above ambient, to eliminate the ligands in their entirety (apart from selected elements intentionally retained to modify the III-V compound) it is necessary to heat the substrate and coating to a temperature in excess of 200° C.

The success of the process of this invention in removing hydrogen, halogen, and organic ligands is attributable to the much higher temperatures required to cleave the thermally stable group III and V element bonds than the ligand bonds. A temperature range is available from about 200° C. to about 450° to 650° C., depending upon the III-V compound selected for preparation, in which ligand volatilization can be effected without cleaving bonds between group III and V elements. It is usually preferred to heat the III-V compound precursor coating to a temperature in the range of from about 250° to 450° C., optimally from about 300° to 400° C. With more thermally resistant III-V compounds this range can be increased and with more readily volatilized ligands the lower temperature can approach 200° C. as a lower limit.

As is well understood in the art, III-V compounds when heated well above ambient temperature are susceptible to oxidation. It is therefore contemplated that the heating step to volatilize the ligands will be undertaken the presence of an inert or reducing atmosphere, such as nitrogen, argon, hydrogen, carbon monoxide, or a mixture of these or similar gases.

Following heating the III-V compound layer and its substrate can be brought back to ambient temperature by any convenient method. To minimize thermal stress on the product article it is generally preferred to return to ambient temperatures gradually. Generally the magnitude of thermal stress increases with the area of the layer being prepared. Thus, in working with larger diameter wafers annealing and slow rates of cooling are desirable. It is also desirable to maintain the layer in contact with the inert or reducing atmosphere until temperatures below about 100° C. are reached.

Upon cooling the III-V compound layer can be put to use without further processing, if desired. For example, the III-V compound layer can be used as formed as a light guide. In most instances further steps are undertaken to produce a desired end product, such as a semiconductor device. These steps can be carried out in any convenient conventional manner for acting on conventional III-V compound coatings and therefore require no detailed description.

EXAMPLES

The invention can be better appreciated by reference to the following specific examples:

EXAMPLE 1

The utility of the organometallic compound PC-4 as a thermal precursor for GaP was initially evaluated by heating a solid sample of PC-4 for 3 hours at 500° C. in a flow of argon.

The resulting black solid was identified as GaP by its powder X-ray diffraction pattern (i.e., by comparison with authentic GaP pattern JCPDS #12-191) and its Raman spectrum. The Raman specturm contained strong absorptions at 356 and 389 cm$^{-1}$ and no absorptions in the spectral regions where residual C-H or amorphous carbon would be expected to give absorptions—e.g., see S. Hayashi, *Solid State Commun.*, 56, 375 (1985).

EXAMPLE 2

Gallium phosphide was formed on a glass substrate by coating an 8% by weight solution of PC-4 in toluene on glass substrate and heating the coated layer for 1 hour at 425° C. in a flow of argon. Examination of the resulting layer by Raman spectroscopy showed the presence of GaP.

EXAMPLE 3

This examples illustrates the thermal decomposition of PC-1 to give gallium arsenide.

The utility of PC-1 as a thermally decomposable precursor for GaAs was demonstrated by heating a sample of PC-1 in an argon atmosphere for 1 hour at 500° C.

The resulting black solid was identified as monophasic GaAs by X-ray diffraction and comparison of results with authentic GaAs pattern JCPDS #32-389.

The invention has been described in detail with particular reference to preferred embodiments thereof, but it will be understood that variations and modifications can be effected within the spirit and scope of the invention.

What is claimed is:

1. A process comprising
   applying to a substrate a precursor of a III-V compound, the precursor consisting of one or more pairs of ligand substituted group III and group V elements and
   thermally decomposing the precursor,
   characterized in that
   the precursor is selected from among compounds in which the group III and V elements of each pair are joined by a thermally stable bond and the group III and V elements are each substituted with two thermally volatilizable ligands,
   a film comprised of the precursor and a liquid carrier, which is a solvent for the precursor and which can be entirely volatilized, is applied to the substrate and spread to form a uniform coating by rotating the substrate, and
   the liquid carrier and ligands are removed from the film, this step including heating the film to a temperature in excess of 200° C. to remove the volatilizable ligands while leaving a ligand free III-V compound as a monophasic layer on the substrate.

2. A process according to claim 1 further characterized in that the Group III elements are chosen from the group consisting of boron, aluminum, gallium and indium.

3. A process according to claim 1 further characterized in that the Group V elements are chosen from the group consisting of nitrogen, phosphorus, arsenic, and antimony.

4. A process according to claim 1 further characterized in that the ligands are chosen from the class consisting of hydrogen, halogen, hydrocarbons, and substituted hydrocarbons.

5. A process according to claim 1 further characterized in that the film is heated to a temperature in the range of from 200° to 650° C.

6. A process according to claim 1 further characterized in tht the precursor satisfies the formula

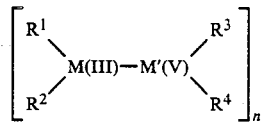

where
   M(III) is a group III element;
   M'(V) is a group V element;
   $R^1$, $R^2$, $R^3$, and $R^4$ are independently chosen volatilizable ligands; and
   n is an integer of from 1 to 5.

7. A process according to claim 6 further characterized in that the film is heated to a temperature in the range of from 250° to 450° C.

8. A process according to claim 6 further characterized in that the substrate is a glass or monocrystalline substrate.

9. A process comprising
   applying to a substrate a precursor of a III-V compound, the precursor consisting of one or more pairs of ligand substituted group III and group V elements and
   thermally decomposing the precursor,
   characterized in that
   a film comprised of the precursor and a liquid carrier, which is a solvent for the precursor and which can be entirely volatilized, is applied to the substrate and then spread to form a uniform coating,
   the liquid carrier and ligands are removed from the film, this step including heating the film to a temperture in excess of 200° C. to remove the volatilizable ligands while leaving a ligand free III-V compound as a monophasic layer on the substrate, and the precursor satisfies the formula:

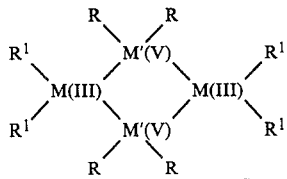

where
M(III) is a group III element chosen from the class consisting of gallium, aluminu, or indium;
M'(V) is a group V element chosen from the class consisting of nitrogen, phosphorus, or arsenic; and
R and R' are independently hydrogen, halogen, or a hydrocarbon of from 1 to 10 carbon atoms.

10. A process according to claim 9 further characterized in that the precursor is chosen from the class consisting of

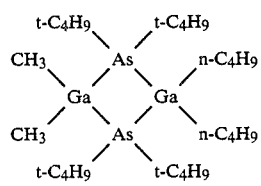

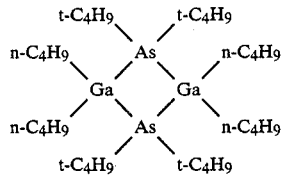

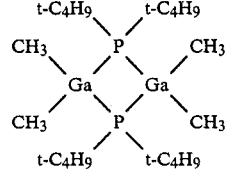

-continued

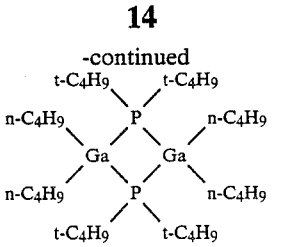

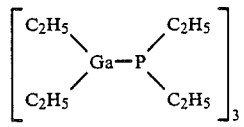

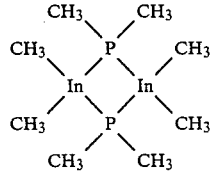

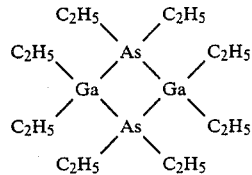

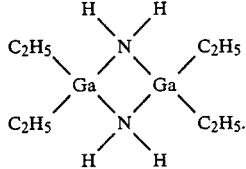

* * * * *